(12) United States Patent
Denny et al.

(10) Patent No.: US 7,453,690 B2
(45) Date of Patent: Nov. 18, 2008

(54) ELECTRONIC COMPONENT INTERCONNECTION AND ASSEMBLY

(75) Inventors: Ian McFarlane Denny, Perth (GB); David Lee Hager, Wake Forest, NC (US); Dean Frederick Herring, Youngsville, NC (US); Jeffrey Millard Huson, Fremont, CA (US); Anthony Wayne Miles, Raleigh, NC (US); Glenn Edward Myrto, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 11/535,570

(22) Filed: Sep. 27, 2006

(65) Prior Publication Data

US 2008/0074837 A1   Mar. 27, 2008

(51) Int. Cl.
   *G06F 1/16* (2006.01)
(52) U.S. Cl. .................. 361/685; 360/97.01; 312/332.1
(58) Field of Classification Search .............. 312/223.2, 312/334.44, 332.1; 385/134–135, 139; 702/61; 239/128, 398; 360/97.01, 97.02; 361/679–687, 361/724–727
See application file for complete search history.

(56) References Cited

U.S. PATENT DOCUMENTS

| | | | |
|---|---|---|---|
| 4,893,405 A | 1/1990 | Pennington | |
| 5,848,906 A | 12/1998 | Glusker et al. | |
| 5,947,753 A | * 9/1999 | Chapman et al. | ............... 439/79 |
| 5,949,645 A | 9/1999 | Aziz et al. | |
| 6,115,258 A | 9/2000 | Hoyle, Jr. et al. | |
| 6,142,802 A | * 11/2000 | Berg et al. | ................... 439/180 |
| 6,466,044 B1 | 10/2002 | Smith | |
| 2005/0095154 A1 | * 5/2005 | Tracey et al. | ............. 417/477.9 |
| 2005/0098299 A1 | * 5/2005 | Goodson et al. | ............ 165/80.3 |

* cited by examiner

*Primary Examiner*—Hung V Duong
(74) *Attorney, Agent, or Firm*—Cynthia Byrd; Jeffrey L. Streets

(57) ABSTRACT

Assembly and connection of electronic components are provided. In one embodiment, electronic components such as a CPU planar, power supplies, and other electronic components or subassemblies are positioned within an enclosure. An interface board removably positionable in the enclosure carries a plurality of electronic connectors, providing an electronic interface between the CPU planar, power supplies, and other electronic subassemblies. The interface board is movably mounted to a component module on a track. The component module is inserted in a first bay, with the attached interface board in a first position. The interface board connects to a movable cable plate, and is subsequently moved to a second position along with the connected cable plate to move one or more of the connectors to a second bay. An electronic subassembly positioned in the second bay or another bay may then be connected the interface board. Other electronic components may be connected to the interface board via the cable plate. The interface board may be locked in a variety of ways in the second position to prevent damage to connected electronic components.

20 Claims, 4 Drawing Sheets

ELECTRONIC COMPONENT INTERCONNECTION AND ASSEMBLY

BACKGROUND OF THE INVENTION

1. Field of the Invention

The present invention relates to electronic assemblies. More particularly, the present invention relates to the assembly and connection between electronic components in a computer system.

2. Description of the Related Art

Computer systems typically include electronic sub-systems and other electronic components or modules arranged and connected within a computer system enclosure. These components include power supplies, power backplanes, CPU planars, and cabling for media and storage. The sophisticated nature of computer systems has led to increasingly compact, high-density component arrangements. Connections between components are often made between different planes, and cross through adjacent compartments of an overall enclosure. The packaging of components and cables therefore presents challenges related to component accessibility. Further challenges arise in the design, assembly, and servicing of computer systems, due to the complexity and number of assembly operations typically required in computer systems.

Conventional approaches to simplifying the assembly of computer systems includes the provision of manual and blind cable connections and rigidly mounted or modular electronic board assemblies. Other approaches include the use of secondary access panels and other enclosure features to provide greater access for making connections. These solutions can add complexity and cost to the enclosure, and increase the potential for electromagnetic compatibility (EMC) issues. Continuing advances are therefore needed in the design and interconnection of electronic components. It would be desirable to have an assembly method and apparatus that were simplified, for example, by eliminating the need for tools during assembly, and by reducing the number of steps required to assemble a computer system. It would be further desirable to have an assembly method and apparatus that was dimensionally tolerant to allow interconnection of multiple components.

SUMMARY OF THE INVENTION

In one embodiment, an apparatus is provided for interconnecting electronic components. An enclosure includes a first enclosure bay and a second enclosure bay adjacent to the first enclosure bay. The first and second enclosure bays are each configured to receive one or more electronic components. An electronic interface board has a plurality of electronic connectors for selectively interfacing between the one or more electronic components from the first and second enclosure bays. A component module includes a chassis for removably receiving one or more electronic components. The chassis is configured for insertion into the first enclosure bay. The chassis includes a coupling for securing the electronic interface board on a leading end of the chassis. An actuator mechanism is operatively coupled to the electronic interface board. The actuator mechanism is actuatable from a trailing end of the chassis for selectively raising the electronic interface board so that at least one of the plurality of electronic connectors of the electronic interface board is disposed in the first enclosure bay and at least one of the plurality of electronic connectors of the electronic interface board is disposed in the second enclosure bay.

In another embodiment, a component module includes a chassis for receiving one or more electronic components. The chassis is configured for slidably inserting in an enclosure. An electronic interface board is movably connected to the chassis. A plurality of electronic connectors is carried on the electronic interface board. An actuator mechanism is operatively coupled to the electronic interface board, for selectively raising the primary electronic interface board.

DETAILED DESCRIPTION OF PREFERRED EMBODIMENTS

Figure 1:
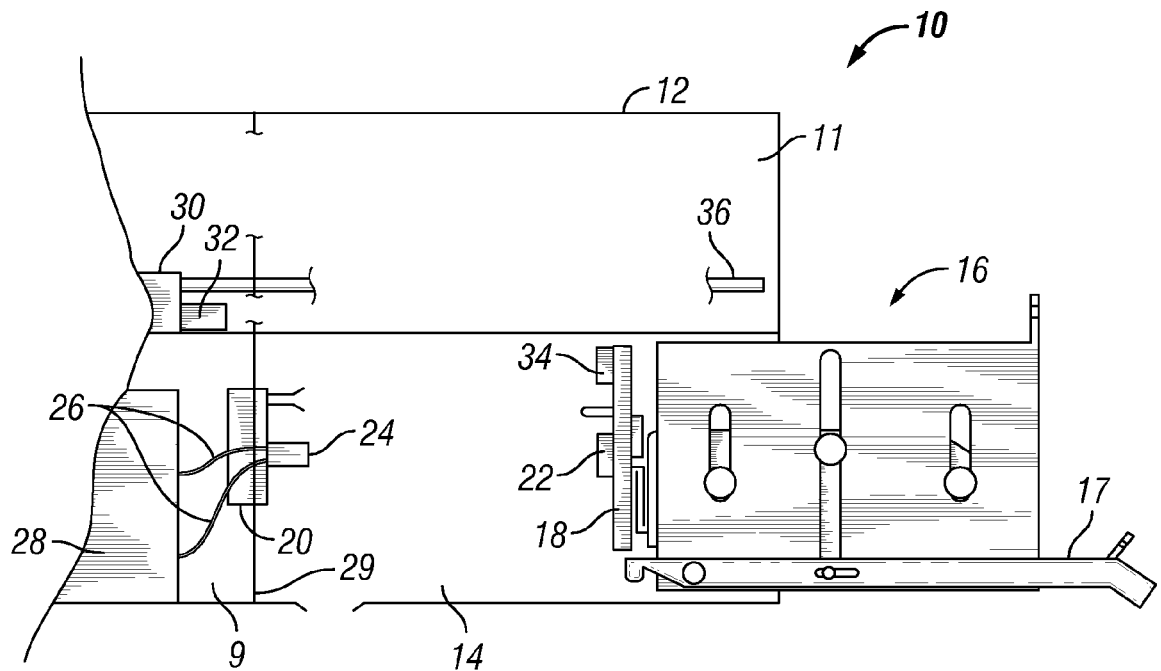
FIG. 1 is a schematic side view of one embodiment of a computer system in a substantially unassembled condition, prior to making electronic connections between components.

The present invention provides improved assembly and connections between electronic components in an enclosure. Many kinds of electronic assemblies are encompassed by the invention. The invention is particularly useful in the realm of computer systems, including personal computers, modular server systems, and other computer systems wherein multiple electronic components and sub-assemblies are assembled within an enclosure. An apparatus according to the invention simplifies the installation and connection of electronic components. Such connections may be easily performed, even where electronic connectors are positioned deep within the enclosure, where access by hand and visibility are otherwise limited or non-existent. The number of steps required to make the connections is reduced. The number of cables required to assemble the components is also reduced. An assembly according to the invention therefore provides greater serviceability and ease of manufacturing.

One embodiment of the invention provides a system that includes an enclosure, a component module for receiving one or more electronic components, a floating, cam-actuated primary interface board (PIB) disposed on the component module, a floating multi-cable plate that interfaces with the PIB, and a plurality of other components to be assembled within the enclosure. The PIB has a plurality of electronic connectors and provides an interface between the various components assembled within the enclosure. The component module is preferably configured for positioning in a lower bay of the enclosure, and subsequently receives one or more of the electronic components. The PIB is supported on the component module in a manner that allows the PIB to be moved up and down, such as along a track. The PIB also has a degree of float to allow the PIB to self-align with other components during connection. The multi-cable plate is similarly mounted within the enclosure.

In order to assemble the system, the empty component module is first inserted in a lower bay of the enclosure with the PIB in a retracted position. Connectors on the multi-cable plate mate with connectors on the PIB when the empty component module is inserted into the bay. Preferably, the PIB is secured to the front face of the component module using floating mounts that facilitate self-alignment of the PIB and multi-cable plate with one another during this connection. After the connectors mate, a cam handle is operated, which actuates the PIB and the now-attached multi-cable plate, preferably in a direction perpendicular to the component module insertion direction. For example, the component module may be inserted horizontally and the PIB may be actuated vertically. Other possible combinations of orientations should be apparent.

With the PIB in its raised position, the PIB partially enters an upper bay, where other components, such as a CPU planar, may then be connected to the PIB via additional electronic connectors. The float in the PIB and the attached multi-cable plate allow the PIB to self-align with the CPU planar during this connection. The engagement of the CPU planar with the PIB may actuate a locking mechanism. For example, the locking mechanism may include a locking rod that is urged through a hole in the cam handle by movement of the CPU planar. The optional locking mechanism preferably constrains movement of the cam handle, which prevents retraction of the PIB while connected to the CPU planar. After the CPU planar has been connected to the PIB, additional components such as power supplies can be installed into the component module, connecting to electronic connectors on the back side of the PIB.

Any float remaining in the PIB after attachment with the multi-cable plate and the CPU planar allows the PIB to self-align with the additional components, such as power supplies. Positioning the power supplies or other components in the component module also prevents downward movement of the cam handle, which provides a further safeguard against retraction of the PIB while connected to the CPU planar. The PIB provides an electronic interface between the power supplies, the CPU planar, and any other components that may be assembled within the enclosure.

FIG. 1 is a side view of one embodiment of a computer system assembly 10 in a substantially unassembled condition, prior to making electronic connections between components. An enclosure 12 of the computer system assembly 10 has multiple bays, including a first bay 14, a second bay 11, and a third bay 9. In this embodiment, the first bay 14 is alternately referred to as a lower bay 14, and the second bay 11 is alternately referred to as an upper bay 11. The lower bay 14 is configured for receiving a component module 16. In FIG. 1, the component module 16 is partially slid into the lower bay 14 in a manner similar to a drawer. The component module 16 fits closely with the lower bay 14 to generally align the component module 16 in a desired orientation within the lower bay 14. The component module 16 is rotationally constrained by virtue of its close fit with the lower bay 14, and is partially constrained laterally, though it is free to slide in and out of the lower bay 14. In other embodiments, alternative mechanisms such as a track or guide rail may be included to align and rotationally constrain a component module with respect to an enclosure bay, without necessarily requiring a close fit between the component module and the enclosure bay.

A "floating" primary interface board (PIB) 18 is secured to the component module 16, and is moveable up and down using an actuator handle 17. A "floating" multi-cable plate ("cable plate") 20 is movably secured to the enclosure 12, and is also free to move up and down. An electronic connector 22 carried on the PIB 18 is configured for mating with an electronic connector 24 carried on the cable plate 20. The electronic connectors ("connectors") 22, 24 may be any of a variety of connectors known in the art. A connector generally includes one or more electrically conducting terminals for contacting one or more electrically conducting terminals on a mating connector, to provide electronic communication (such as signal or power transfer) between electronic components in the assembly 10. Most connectors also include a mechanical connection, such as a frictional slip fit between a male connector and a mating female connector, which secures the mating connectors in a manner to maintain contact between the contacting terminals. Flexible cables 26 provide electronic communication between an electronic subassembly 28, positioned in the third bay 9, with the connector 24, even as the cable plate 20 moves up and down. Another electronic subassembly, which in this embodiment is a CPU planar 30, is positioned in the third bay 11 of the enclosure 12. A connector 32 on the CPU planar 30 is configured for mating with another connector 34 on the PIB 18. The PIB 18 may therefore serve as an interface to provide electronic communication between the electronic subassembly 28 and the CPU planar 30.

Figure 2:
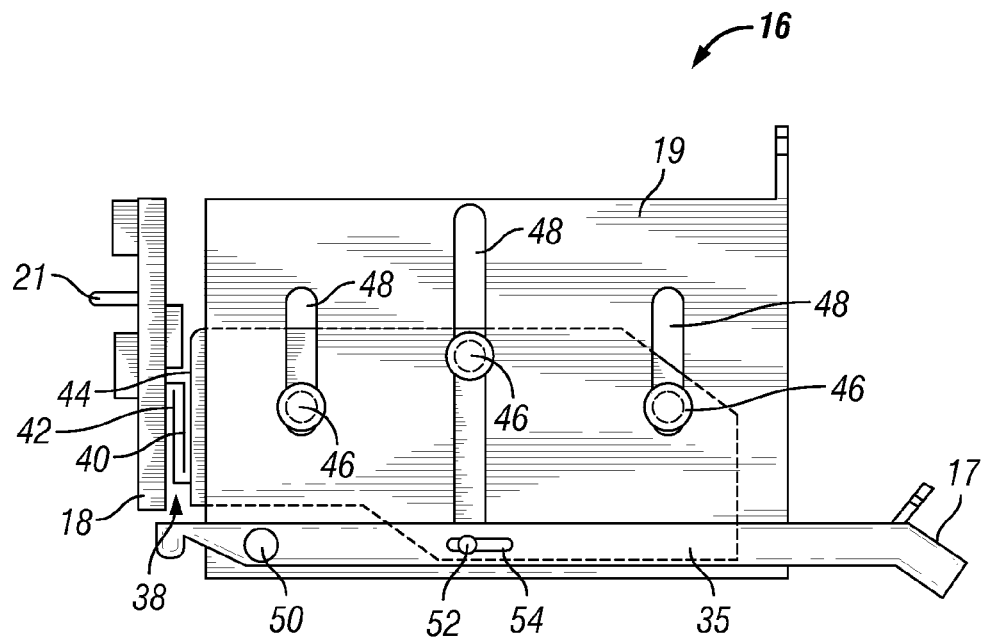
FIG. 2 is a schematic side view of the component module with the handle in a lowered position.

FIG. 2 is a side view of the component module 16 in closer detail, with the handle 17 in a lowered position. The PIB 18 is removably secured to a cam plate 44 of the component module 16 using a bracket 38 having a frictional slip fit. The cam plate 44 is mounted inside the component module 16, as indicated by the dashed lines in the figure. The slip fit allows the PIB 18 to "float" left and right (into and out of the page), as well as up and down, even when the handle 17 is subsequently raised and locked. In that context, the frictional slip fit may be alternatively referred to as one embodiment of a "floating mount." The float is typically on the order of a few millimeters up, down, left, or right, and may include some degree of rotation or angular orientation. The frictional slip fit provides at least some resistance to this float, though the resistance can generally be overcome by hand to move or position the PIB 18 on the component module 16. Alternative types of floating attachments are within the scope of the invention. An alignment pin 21 is disposed on the PIB 18, which will be used to self-align the PIB 18 with the cable plate 20 (FIG. 1).

In addition to the float provided by the bracket 38, the PIB 18 can be moved up and down along a track, typically on the order of up to several centimeters. In the embodiment of FIG. 2, a track includes slots 48 for guiding movement of the cam plate 44 and the attached PIB 18. The bracket 38 includes a first bracket member 40 secured to the PIB 18 and a second bracket member 42 secured to the cam plate 44. The cam plate is movably secured to a chassis 19 of the component module 16 via pins 46 riding in slots 48 of the component module's chassis 19. The actuator handle 17 includes an arm 35 pivotally secured to the chassis 19 with a pin 50. The cam plate 44 is secured to the arm 35 with a pin 52, which rides in a slot 54 on the arm 35. Alternative types of tracks for providing guided movement of the PIB 18 also fall within the scope of the invention, as will be appreciated by one skilled in the art having benefit of this disclosure.

Figure 3:
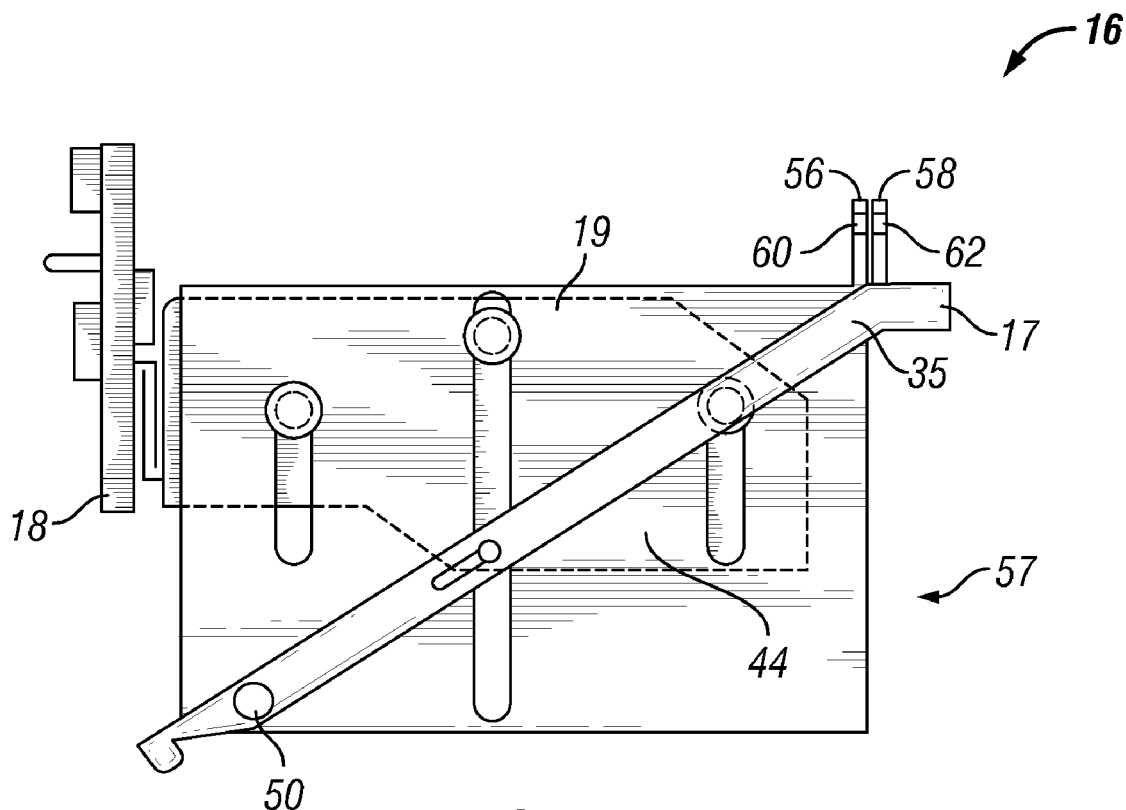
FIG. 3 is a schematic side view of the component module with the handle raised and the arm rotated upward about the pin, positioning the cam plate and the attached PIB in upper positions.

FIG. 3 is a side view of the component module 16 with the handle 17 raised and the arm 35 rotated upward about the pin 50, positioning the cam plate 44 and the attached PIB 18 in an upper position. The PIB 18 is now in an upper position, partially entering the upper bay 11 (See FIG. 1). A flange 56 is secured to the chassis 19 of the component module 16, and another flange 58 is secured to the handle 17. With the handle 17 raised as shown, the flanges 56, 58 are positioned adjacent to one another, with a hole 60 in the flange 56 aligned with a hole 62 in the flange 58. As described below, the alignment of the holes 60, 62 will allow a locking rod to be inserted into the holes 60, 62 to lock the handle 17 in the upper position of FIG. 3. The component module 16 includes an internal compartment 57 for receiving one or more electronic components (not shown) after the empty component module 16 has been inserted into the enclosure 12 (FIG. 1) and the handle 17 has been raised. The cam plate 44 rides closely to an interior wall of the compartment 57, to avoid interference with any electronic components subsequently disposed therein.

Figure 4:
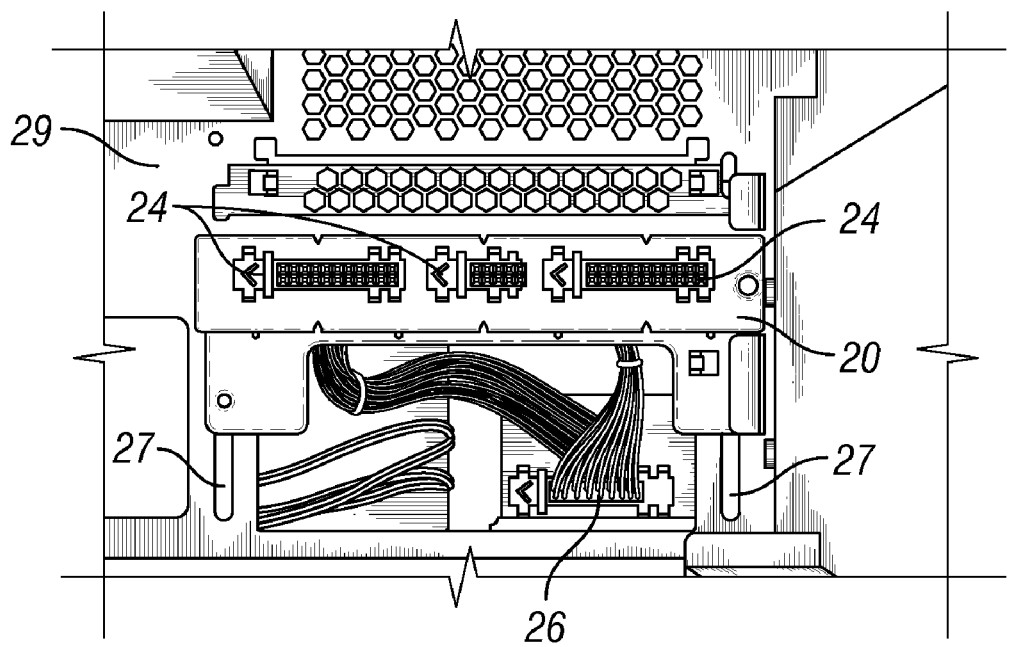
FIG. 4 is an end view of the enclosure from an end facing into the empty lower bay, with the component module removed.

FIG. 4 is an end view of the enclosure 12 from an end facing into the empty lower bay 14, with the component module 16 removed. The multi-cable plate 20, like the PIB, is also guided along a track that allows the cable plate 20 to be raised and lowered along with the attached PIB 18. Specifically, the cable plate 20 is movably guided on a pair of slots 27 formed on an internal wall 29 (see also FIG. 1) of the enclosure. The cable plate 20 is shown in its raised position for illustration, although without the component module inserted, the cable plate 20 is ordinarily biased by gravity to its lowered position. The variously-sized connectors 24 are carried on the cable plate 20. The cables 26 can be seen in the figure, connected between the connectors 24 and the electronic subassembly disposed behind the internal wall 29.

Figure 5:
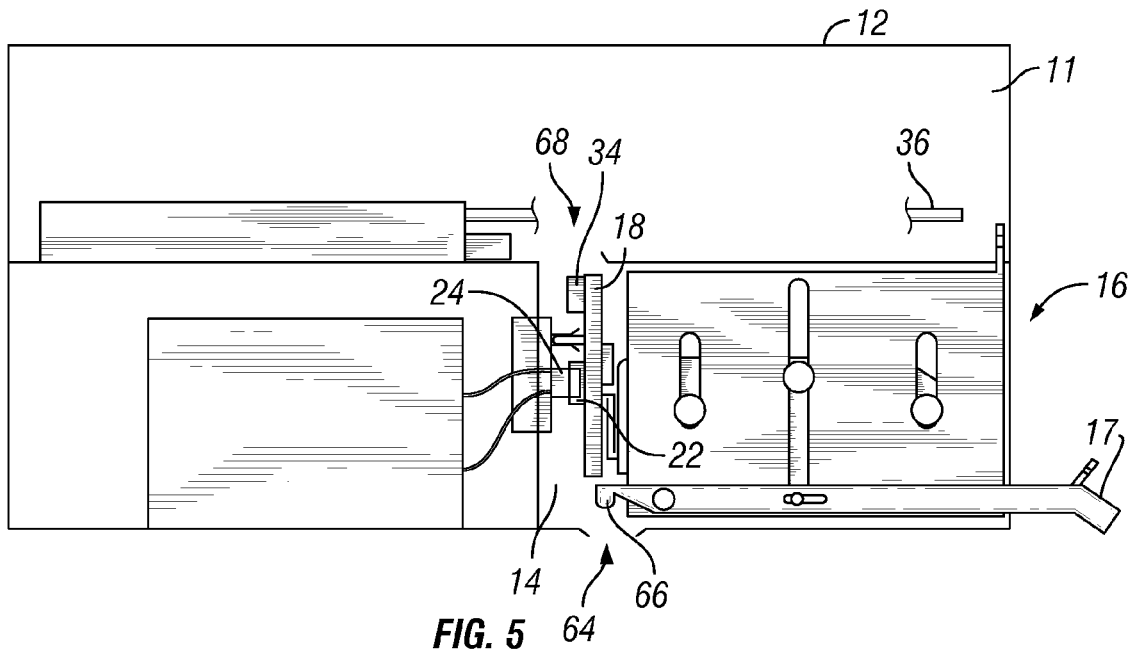
FIG. 5 is a schematic side view of the computer system assembly, wherein the component module is fully inserted into the lower bay with the handle in its lowered position.
Figure 5A:
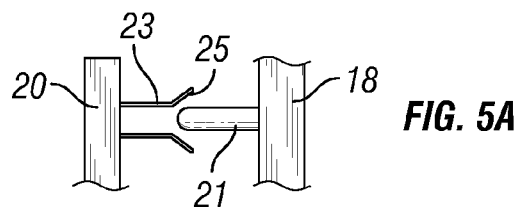

FIG. 5 is a side view of the computer system assembly 10 following what may be described as a first step in assembling the computer system assembly 10, wherein the component module 16 is fully inserted into the lower bay 14 of the enclosure 12 with the handle 17 in the lowered position. The close fit between the component module 16 and the lower bay 14 provide at least a rough alignment of connectors between the PIB 18 with the cable plate 20 when the component module 16 is first inserted. Referring also to FIG. 5A, at least one alignment pin 21 engages at least one respective alignment hole 23 to more precisely align the PIB 18 with the cable plate 20 during the approach of the connectors. The alignment hole 23 includes a shoulder 25. If the alignment pin 21 is not already fully aligned with the alignment hole 23 by virtue of the rough alignment provided between the closely fitting component module 16 and lower bay 14, the alignment pin 21 will impinge the shoulder 25 as the component module is moved into its fully inserted position of FIG. 5. The shoulder 25 thereby guides the alignment pin 21 into the desired alignment with the alignment hole 23. The alignment of the pin 21 with the alignment hole 23 provides the desired precise alignment between the PIB 18 and the cable plate 20, so that the connectors 22, 24 connect. The floating mount of the PIB 18 and the cable plate 20 allows self-alignment between the PIB 18 and the cable plate 20 to occur without binding of the components or stress on the connectors. Aside from the alignment pin 21 and hole 23, alternative alignment mechanisms fall within the scope of the invention. For example, some connectors known in the art have a mechanical interconnection that includes a shoulder on one or both of two mating connectors, such that the mating connectors more precisely align when engaged.

The alignment pin(s) 21 and alignment hole(s) 23 also provide a structural connection between the PIB 18 and the cable plate 20, so that when the PIB 18 is subsequently raised, the cable plate 20 also raises. This minimizes lateral stresses on the electronic connectors 22, 24 when the PIB 18 is raised, to prevent damage thereto.

The PIB 18 is now connected to the floating cable plate 20 with the electrical connectors 22, 24. The handle 17 is in its lowered position, and the PIB 18 and cable plate 20 are also both in their lowered positions. An aperture 64 is disposed in the enclosure 12, positioned for receiving a retainer tab 66 on the handle 17 when the handle 17 is subsequently raised. An aperture 68 is also disposed in the enclosure 12, along a wall 70 that separates the lower bay 14 from the second ("upper") bay 11. The aperture 68 is positioned for receiving the PIB 18 when the handle 17 is subsequently raised, so that the connector(s) 34 are able to move from the lower bay 14 to the upper bay 11.

Figure 6:
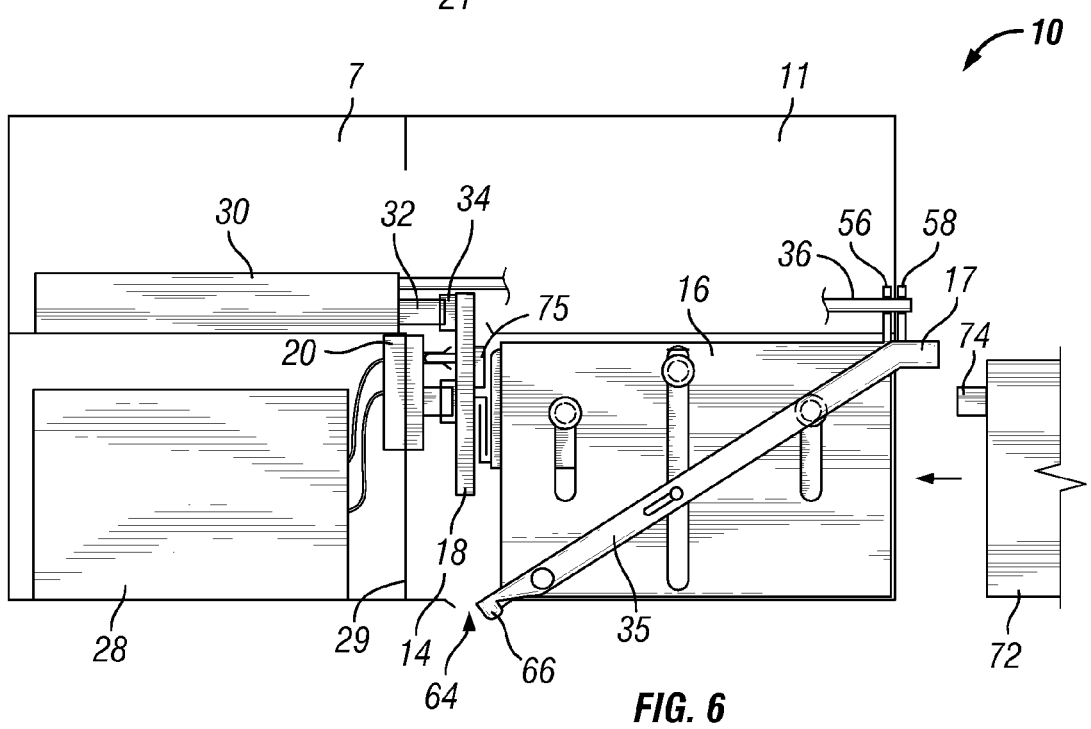
FIG. 6 is a schematic side view of the computer system assembly, wherein the primary interface board (PIB) is raised and connected to the CPU planar.

FIG. 6 is a side view of the computer system assembly 10 following what may be described as the second step in assembling the computer system assembly 10, wherein the PIB 18 is raised and connected to the CPU planar 30. As shown, the handle 17 is in an upper position, which places both the PIB 18 and the now-connected cable plate 20 in an upper position. The connector 34 is now positioned in the upper bay 11. With the handle 17 raised, the retainer tab 66 is positioned in the aperture 64, which "locks" the component module 16 into the lower bay 14 to prevent the component module 16 from being slid out of the lower bay 14. After raising the PIB 18, the CPU planar 30 has been moved into connection with the PIB 18, mating the connectors 32 and 34. The CPU planar 30 may optionally be moved by hand into connection with the PIB 18, particularly where direct access is provided from above the third bay 11 or from the front of the third bay (left side as shown in FIG. 6). Alternatively, an actuator may be included for moving the CPU planar 30. The PIB 18 and attached cable plate 20 still have some remaining float, although that float may be less than the maximum float of the PIB 18 or cable plate 20 individually, due to differences in tolerances or other mechanical constraints. The CPU planar 30 may also have some degree of float. With the PIB 18 raised, the PIB 18 is already in at least a rough alignment with the CPU planar 30. An alignment feature (not shown), such as an alignment pin (optionally similar to that of FIG. 5A), or a shoulder on one or both of the connectors 32, 34, may be included for more precisely aligning the connectors 32, 34. The remaining float in the PIB 18 and attached cable plate 20 allows the PIB 18 to move at least slightly during this more precise alignment. Any float in the CPU planar 30 also allows the CPU planar 30 to move at least slightly during this more precise alignment. Optionally, movement of the CPU planar 30 into engagement with the PIB 18 simultaneously engages a locking rod 36, urging the locking rod 36 through the flanges 56, 58. With the handle 17 locked in its raised position, appreciable downward movement of the PIB 18 along its track is prevented, to avoid damage to the CPU planar 30 or the PIB 18. Accordingly, the CPU planar 30 must be disconnected from the PIB 18 if it is desired to subsequently lower the handle 17.

With the components of the computer system assembly 10 connected as shown in FIG. 6, the electronic subassembly 28 and the CPU planar 30 are now in electronic communication through the cable plate 20 and the attached PIB 18. The third step is to insert one or more power supplies 72 or other additional components into the component module 16 and connect the power supplies 72 to the PIB 18. A connector 74 on the power supply 72 aligns with and mates to a connector 75 on the PIB 18. With the one or more power supplies 72 connected to the PIB 18, the power supplies 72 may supply power through the PIB 18 to other components, including the electronic subassembly 28 and the CPU planar 30.

Figure 7:
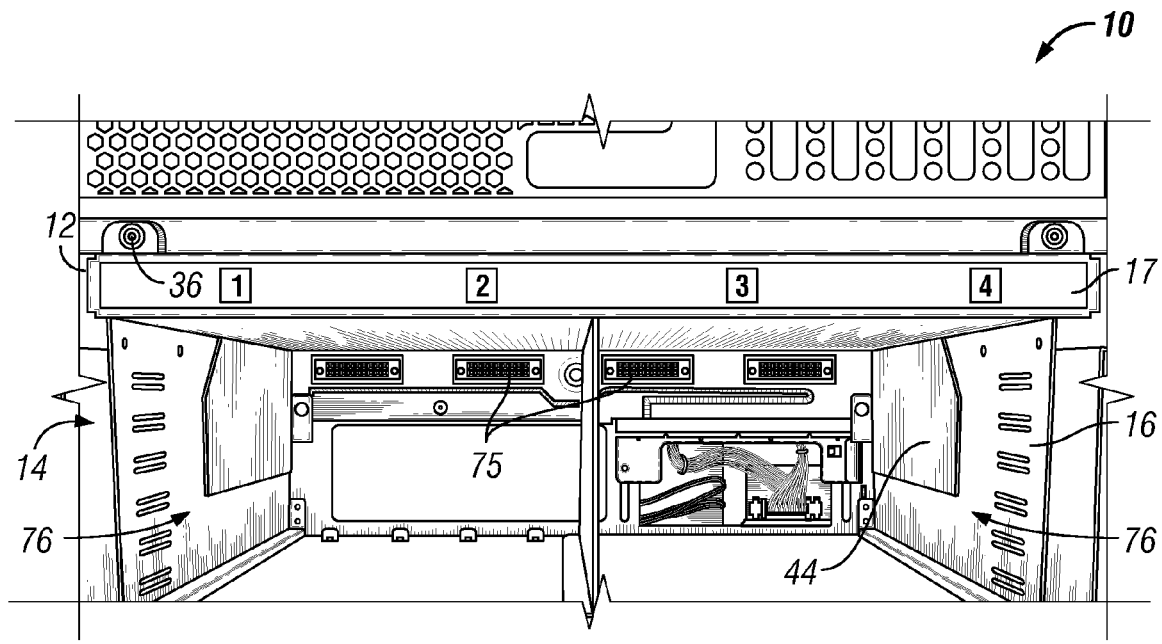
FIG. 7 is an end view of the component module, as viewed from the right in FIG. 6, inserted in the lower bay of the chassis.

FIG. 7 is an end view of the component module 16, as viewed from the right in FIG. 6, inserted in the lower bay 14 of the enclosure 12. The handle 17 is locked in its upper position, with the lock rods 36 inserted through the handle 17. The cam plate 44 can now be seen from the inside of the component module 16. Four connectors 75 are disposed on the PIB 18, each of which may be connected with one power supply. In the embodiment shown, two power supplies may be inserted into each of two compartments 76 of the component module 16.

Figure 8:
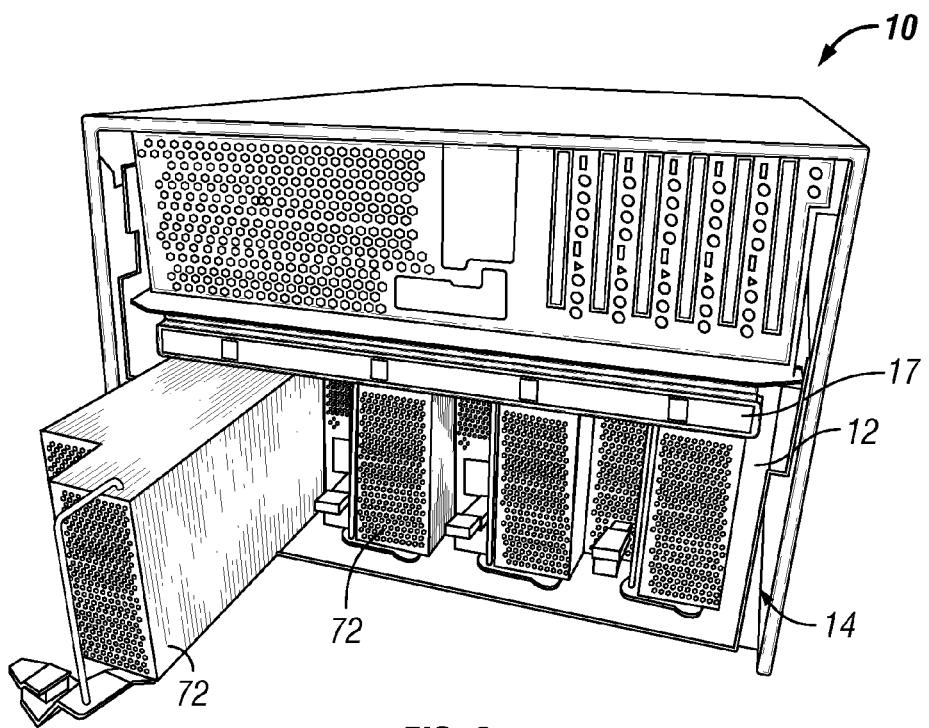
FIG. 8 is another end view of the component module with four power supplies inserted.

FIG. 8 is another end view of the component module 16 with four power supplies 72 inserted. Three of the power supplies 72 (on the right) are fully inserted, and one power supply 72 (on the left) is partially inserted. The power supplies 72 fit closely within the lower bay 14 of the enclosure 12. The handle 17 is also configured so that it cannot be actuated with the power supplies 72 installed, regardless of whether the CPU planar is installed. Preferably, the power supplies 72 mechanically interfere with any downward movement of the handle 17, due to their positioning within the component module 16. Thus, even if the CPU planar is not connected, and the lock rods are therefore not engaged with the handle 17, the presence of the power supplies 72 prevents appreciable downward movement of the handle 17, desirably preventing inadvertent movement of the PIB and avoiding damage to connectors that would otherwise result.

Those skilled in the art will recognize that the exemplary components and electronic subassemblies that may be assembled and connected according to the invention are not limited to those discussed herein. The assembly and connection of CPU planars and power supplies discussed in the embodiments above are exemplary. The invention may be applied to the assembling and connection of media, PCI adaptors, additional planars, and other electronic components.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for interconnecting electronic components, comprising:
   an enclosure including a first enclosure bay and a second enclosure bay adjacent to the first enclosure bay, wherein the first and second enclosure bays are each configured to receive one or more electronic components;
   an electronic interface board having a plurality of electronic connectors for selectively interfacing between the one or more electronic components from the first and second enclosure bays;
   a component module including a chassis for removably receiving one or more electronic components, wherein the chassis is configured for insertion into the first enclosure bay and includes a coupling for securing the electronic interface board on a leading end of the chassis, and an actuator mechanism operatively coupled to the electronic interface board and actuatable from a trailing end of the chassis for selectively raising the electronic interface board so that at least one of the plurality of electronic connectors of the electronic interface board is disposed in the first enclosure bay and at least one of the plurality of electronic connectors of the electronic interface board is disposed in the second enclosure bay.

2. The apparatus of claim 1, wherein the raised electronic interface board serves as a multilevel interconnect with electronic components disposed in each of the first enclosure bay and the second enclosure bay.

3. The apparatus of claim 1, further comprising an electronic interface board track for guiding movement of the electronic interface board with respect to the component module.

4. The apparatus of claim 1, further comprising:
   a cable plate movably secured to the enclosure and having at least one electronic connector for selectively interfacing with one or more of the electronic connectors disposed on the electronic interface board; and
   one or more cables connecting the cable plate with an electronic subassembly disposed in the enclosure.

5. The apparatus of claim 4, wherein at least one of the plurality of electronic connectors of the electronic interface board blind mates with at least one electronic connector of the cable plate.

6. The apparatus of claim 4, further comprising a cable plate track for guiding movement of the cable plate with respect to the enclosure.

7. The apparatus of claim 1, wherein the actuator mechanism includes an actuator handle coupled to the electronic interface board, wherein moving the handle moves the electronic interface board.

8. The apparatus of claim 7, further comprising a moveable locking member for selectively engaging the handle to prevent movement of the handle.

9. The apparatus of claim 8, wherein the moveable locking member is actuated by movement of a component board during an engagement of the component board with one of the electronic connectors.

10. The apparatus of claim 7, wherein the electronic component interferes with movement of the handle when the electronic component is positioned in the component module, thereby preventing damage to any installed components.

11. The apparatus of claim 1, further comprising:
    a cam plate, wherein the electronic interface board is removably secured to the cam plate;
    one or more slots disposed on the component module or the cam plate; and
    one or more pins riding in the one or more slots and passing through the cam plate and the component module for guiding the movement of the electronic interface board with respect to the component module.

12. The apparatus of claim 11, further comprising a floating connection between the electronic interface board and the cam plate.

13. The apparatus of claim 11, wherein the floating connection comprises a frictional slip fit between the electronic interface board and the cam plate.

14. The apparatus of claim 1, wherein the component module fits closely with the first enclosure bay to constrain the component module rotationally with respect to the first enclosure bay.

15. The apparatus of claim 1, wherein the one or more electronic components received by the component module fit closely with the component module, to constrain the one or more electronic components rotationally with respect to the component module.

16. A component module, comprising:
- a chassis for receiving one or more electronic components, the chassis configured for slidably inserting in an enclosure;
- an electronic interface board movably connected to the chassis;
- a plurality of electronic connectors carried on the electronic interface board; and
- an actuator mechanism operatively coupled to the electronic interface board, for selectively raising the primary electronic interface board.

17. The component module of claim 16, further comprising a track for guiding movement of the electronic interface board with respect to the component module.

18. The component module of claim 16, wherein the actuator assembly includes an actuator handle coupled to the electronic interface board, such that movement of the handle moves the electronic interface board.

19. The component module of claim 16, further comprising a moveable locking member for selectively engaging the handle to prevent movement of the handle.

20. The component module of claim 16, further comprising:
- a cam plate, wherein the electronic interface board is removably secured to the cam plate;
- one or more slots disposed on the component module or the cam plate; and
- one or more pins riding in the one or more slots and passing through the cam plate and the component module for guiding the movement of the electronic interface board with respect to the component module.

* * * * *